United States Patent
Chow et al.

(10) Patent No.: US 8,080,885 B2
(45) Date of Patent: Dec. 20, 2011

(54) INTEGRATED CIRCUIT PACKAGING SYSTEM WITH MULTI LEVEL CONTACT AND METHOD OF MANUFACTURE THEREOF

(75) Inventors: Seng Guan Chow, Singapore (SG); Heap Hoe Kuan, Singapore (SG); Rui Huang, Singapore (SG)

(73) Assignee: Stats Chippac Ltd., Singapore (SG)

( * ) Notice: Subject to any disclaimer, the term of this patent is extended or adjusted under 35 U.S.C. 154(b) by 180 days.

(21) Appl. No.: 12/273,547

(22) Filed: Nov. 19, 2008

(65) Prior Publication Data

US 2010/0123251 A1    May 20, 2010

(51) Int. Cl.
- H01L 23/28 (2006.01)
- H01L 23/31 (2006.01)
- H01L 23/48 (2006.01)
- H01L 21/56 (2006.01)
- H01L 21/60 (2006.01)

(52) U.S. Cl. ........ 257/787; 257/698; 257/738; 257/777; 257/778; 257/780; 257/784; 257/786; 257/E23.01; 257/E23.116; 257/E23.123; 257/E21.503; 257/E21.506; 438/127; 438/108

(58) Field of Classification Search ............ 438/127, 438/108; 257/698, 737, 738, 777, 778, 780, 257/784, 786, 787, E23.01, E23.011, E23.116, 257/E23.123, E21.502, E21.503, E21.506
See application file for complete search history.

(56) References Cited

U.S. PATENT DOCUMENTS

| | | | |
|---|---|---|---|
| 564,130 A * | 7/1896 | Wiedring | 426/11 |
| 5,399,804 A | 3/1995 | Yoneda et al. | |
| 5,569,625 A | 10/1996 | Yoneda et al. | |
| 5,783,463 A * | 7/1998 | Takehashi et al. | 438/112 |
| 5,862,248 A * | 1/1999 | Salatino et al. | 382/124 |
| 5,976,916 A * | 11/1999 | Kuwamura et al. | 438/126 |
| 6,008,073 A * | 12/1999 | King et al. | 438/123 |
| 6,121,684 A * | 9/2000 | Liaw | 257/758 |
| 6,407,456 B1 * | 6/2002 | Ball | 257/777 |
| 6,441,495 B1 * | 8/2002 | Oka et al. | 257/777 |
| 6,507,104 B2 * | 1/2003 | Ho et al. | 257/712 |
| 6,590,281 B2 * | 7/2003 | Wu et al. | 257/684 |
| 6,762,490 B2 * | 7/2004 | Suzuki | 257/692 |
| 7,026,709 B2 | 4/2006 | Tsai et al. | |
| 7,132,752 B2 * | 11/2006 | Saeki | 257/777 |
| 7,279,795 B2 * | 10/2007 | Periaman et al. | 257/777 |
| 7,317,256 B2 * | 1/2008 | Williams et al. | 257/777 |
| 7,339,257 B2 * | 3/2008 | Ozawa et al. | 257/666 |
| 7,554,203 B2 * | 6/2009 | Zhou et al. | 257/777 |
| 7,598,617 B2 * | 10/2009 | Lee et al. | 257/777 |
| 7,656,031 B2 * | 2/2010 | Chen et al. | 257/733 |
| 7,728,412 B2 * | 6/2010 | Takahashi | 257/666 |
| 7,741,154 B2 * | 6/2010 | Ha et al. | 438/109 |
| 7,812,449 B2 * | 10/2010 | Kuan et al. | 257/738 |
| 2003/0080405 A1 * | 5/2003 | Suzuki | 257/690 |
| 2005/0051877 A1 * | 3/2005 | Hsu | 257/667 |
| 2005/0236698 A1 * | 10/2005 | Ozawa et al. | 257/666 |

(Continued)

*Primary Examiner* — Mary Wilczewski
(74) *Attorney, Agent, or Firm* — Mikio Ishimaru

(57) ABSTRACT

A method of manufacture of an integrated circuit packaging system includes: forming a first level contact on a first external connection level; forming a second level contact on a second external connection level next to the first external connection level; attaching a device adjacent the first level contact and the second level contact; attaching a first level device connector to the first level contact and the device; attaching a second level device connector to the second level contact and the device; and forming an encapsulant over the first level contact, the second level contact, the first level device connector, and the second level device connector.

20 Claims, 3 Drawing Sheets

U.S. PATENT DOCUMENTS

| | | |
|---|---|---|
| 2008/0137312 A1 | 6/2008 | Lee et al. |
| 2008/0145589 A1 | 6/2008 | Hung et al. |
| 2008/0265399 A1* | 10/2008 | Chao .............................. 257/698 |
| 2008/0272465 A1* | 11/2008 | Do et al. ........................ 257/620 |
| 2009/0085225 A1* | 4/2009 | Park .............................. 257/777 |
| 2009/0236753 A1* | 9/2009 | Moon et al. ................... 257/777 |
| 2009/0283898 A1* | 11/2009 | Janzen et al. .................. 257/698 |
| 2009/0321899 A1* | 12/2009 | Do et al. ........................ 257/666 |
| 2010/0001386 A1* | 1/2010 | Misumi et al. ................ 257/676 |
| 2010/0123251 A1* | 5/2010 | Chow et al. ................... 257/773 |
| 2010/0127367 A1* | 5/2010 | Chou ............................. 257/676 |
| 2010/0127372 A1* | 5/2010 | Holland ......................... 257/685 |

\* cited by examiner

INTEGRATED CIRCUIT PACKAGING SYSTEM WITH MULTI LEVEL CONTACT AND METHOD OF MANUFACTURE THEREOF

TECHNICAL FIELD

The present invention relates generally to integrated circuit packaging systems and more particularly to a system for integrated circuit packages with multi level contacts.

BACKGROUND ART

Integrated circuit devices have pervaded virtually all aspects of modern life. From cell phones to equipment for manufacturing airplanes, integrated circuit devices improve processes and machines that are often take for granted.

The demands for electronic devices with integrated circuits increasingly require more functions with faster response in reduced dimensions and at lower prices. These high performance devices often demand all of lighter, faster, smaller, multi-functional, highly reliable, and lower cost.

In efforts to meet such requirements, improvements have been attempted in many aspects of electronic product development such as producing smaller and less expensive semiconductor chips. Unfortunately, this development is still not enough to satisfy the demands. Every aspect including packaging can contribute.

A commonly used integrated circuit or semiconductor device methodology for packaging uses a substrate for the semiconductor chips. The substrate or "board" provides a connection pattern of input and output elements such as contacts, leads, or other electrodes connecting the integrated circuit.

Numerous technologies have been developed to meet these requirements. Some research and development focused on new package technologies while others focused on improving existing and mature package technologies. Research and development in package technologies may include a seemingly endless number of different approaches.

One proven way to reduce cost is to use package technologies with existing manufacturing methods and equipments. Paradoxically, the reuse of existing manufacturing processes does not typically result in the reduction of package size. Existing packaging technologies struggle to cost effectively meet demands of today's integrated circuit packages.

Of course, the requirement of additional material including the substrate undesirably increases the thickness and cost of fabricating the package. Moreover, the use of an additional substrate material may undesirably increase the manufacturing cycle time, which can also increase cost.

Despite the advantages of recent developments in semiconductor fabrication and packaging techniques, there is a continuing need for improving electronic device size, performance, reliability, and manufacturing.

Thus, a need still remains for an integrated circuit packaging system with improved manufacturing processes and materials. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a first level contact on a first external connection level; forming a second level contact on a second external connection level next to the first external connection level; attaching a device adjacent the first level contact and the second level contact; attaching a first level device connector to the first level contact and the device; attaching a second level device connector to the second level contact and the device; and forming an encapsulate over the first level contact, the second level contact, the first level device connector, and the second level device connector.

The present invention provides an integrated circuit packaging system including: a first level contact on a first external connection level; a second level contact on a second external connection level next to the first external connection level; a device adjacent the first level contact and the second level contact; a first level device connector to the first level contact and the device; a second level device connector to the second level contact and the device; and an encapsulate over the first level contact, the second level contact, the first level device connector, and the second level device connector.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
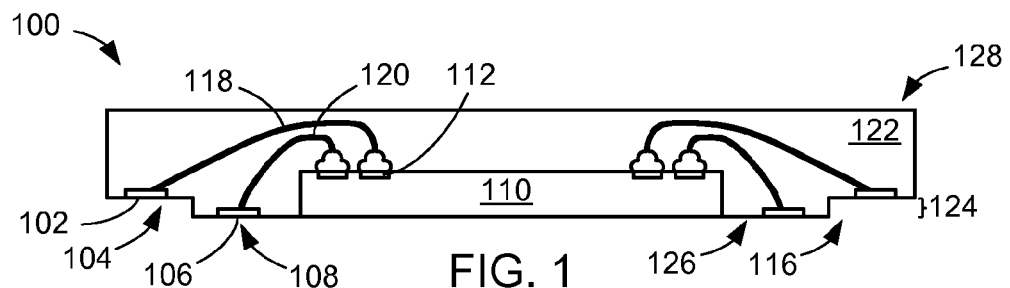
FIG. 1 is a cross-sectional view of an integrated circuit packaging system taken along line 1-1 of FIG. 3 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals. The embodiments may have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "above", "below", "bottom", "top", "side"(as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Figure 3:
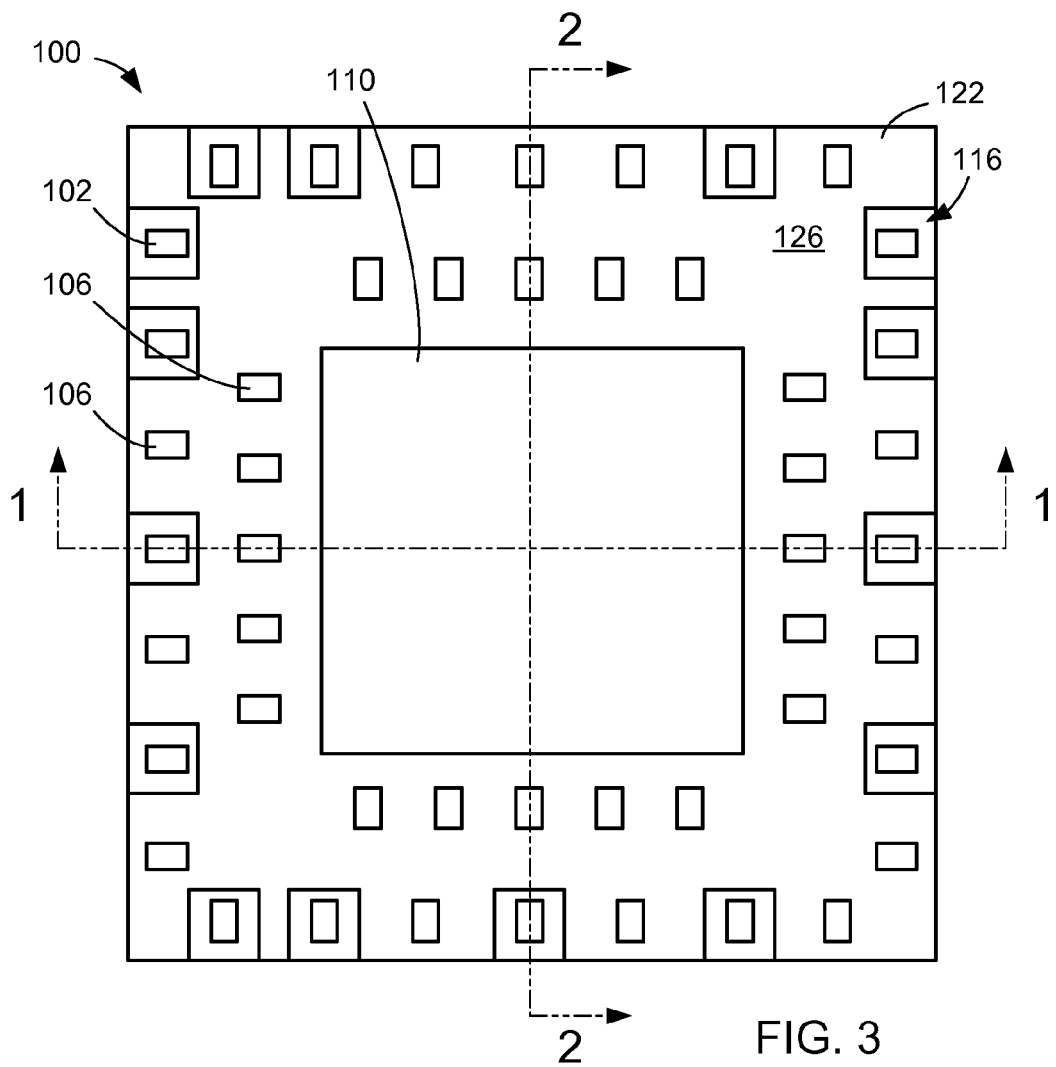
FIG. 3 is a bottom plan view of the integrated circuit packaging system.

Referring now to FIG. 1, therein is shown a cross-sectional view of an integrated circuit packaging system 100 taken along line 1-1 of FIG. 3 in a first embodiment of the present invention. The integrated circuit packaging system 100 preferably includes a first level contact 102 over or on a first external connection level 104, and a second level contact 106 over or on a second external connection level 108. The first external connection level 104 is formed next to the second external connection level 108 on a same side of the integrated circuit packaging system 100.

A portion of the first level contact 102 is substantially exposed adjacent the first external connection level 104 providing connectivity to other components such as devices or packages. Similarly, a portion of the second level contact 106 is substantially exposed adjacent the second external connection level 108 also providing connectivity to other components such as devices or packages.

A device 110 such as an integrated circuit or a package can be attached or mounted over or on the second external connection level 108 and adjacent to the first external connection level 104. The device 110 can include connection regions 112 such as bond pads or bumps exposed on a side such as an active side of the device 110. The connection regions 112 provide electrical connectivity to circuitry in the device 110.

The first external connection level 104 with the first level contact 102 can be separated from the second external connection level 108 with the second level contact 106 by a recess 116. The recess 116 can provide spacing for connectors, isolation from other connectors, or varied sizes of connectors.

For example, the recess 116 can provide the first external connection level 104 above the second external connection level 108.

For illustrative purposes, the recess 116 is shown providing the first external connection level 104 substantially parallel to the second external connection level 108 although it is understood that the recess 116 can provide other configurations for the first external connection level 104 or the second external connection level 108. Further, for illustrative purposes the recess 116 is shown as having a substantially orthogonal shape although it is understood that the recess 116 can be other shapes or configurations.

First level device connectors 118 such as wires or other conductors can connect the connection regions 112 of the device 110 and the first level contact 102 for electrical transmission such as an electrical signal or level. Similarly, second level device connectors 120 such as wires or other conductors can connect the connection regions 112 of the device 110 and the second level contact 106.

An encapsulate 122 having a bottom side 126 and a top side 128 can be formed over the device 110, the first level device connectors 118, the second level device connectors 120, the first level contact 102, or the second level contact 106 for forming a package bottom at the bottom side 126 of the encapsulate 122. The encapsulate can provide a portion of the first level contact 102 or the second level contact 106 substantially exposed. The forming of the encapsulate 122 provides the first external connection level 104, the second external connection level 108, and an inactive side of the device 110 exposed from the package bottom.

The encapsulate 122 can provide an offset 124 between the first external connection level 104 and the second external connection level 108 forming the recess 116. The second external connection level 108 can be formed substantially planar to the bottom side 126 with the first external connection level 104 above the bottom side 126 and closer to the top side 128 than the second external connection level 108 by the offset 124.

For illustrative purposes, contacts nearest an outer edge of the integrated circuit packaging system 100 are shown as the first level contact 102 and the contacts nearest the device 110 as the second level contact 106 although it is understood that they may be different.

It has been discovered that the present invention with the first external connection level 104 and the second external connection level 108 having the recess 116 can eliminate cavities, reduce profiles, or utilize existing mold chase designs including flat top mold chases or other non-customized mold chases to form the top side 128.

It has been unexpectedly found that the first external connection level 104 and the second external connection level 108 having the offset 124 can provide thinner profiles particularly with stack devices or packages such as Fan-in Package-on-Package (Fi-PoP or Fi-PoPb) designs including ball grid arrays or other interconnection technologies.

Thus, it has been discovered that the integrated circuit packaging system and device of the present invention furnish important and heretofore unknown and unavailable solutions, capabilities, and functional aspects for stack devices.

Figure 2:
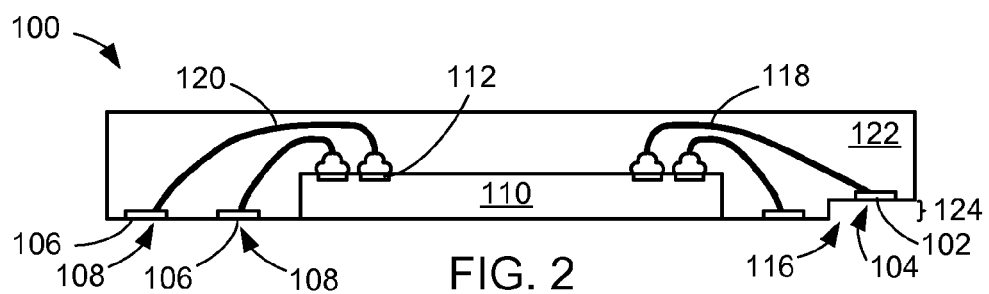
FIG. 2 is a cross-sectional view of the integrated circuit packaging system taken along line 2-2 of FIG. 3.

Referring now to FIG. 2, therein is shown a cross-sectional view of the integrated circuit packaging system 100 taken along line 2-2 of FIG. 3. The integrated circuit packaging system 100 preferably includes the recess 116 with the first external connection level 104 having the first level contact 102 and the second external connection level 108 having the second level contact 106.

The first level device connectors 118 can connect the connection regions 112 of the device 110 and the first level contact 102 for electrical transmission such as an electrical signal or level. Similarly, the second level device connectors 120 can connect the connection regions 112 of the device 110 and the second level contact 106.

For illustrative purposes, the offset 124 forming the recess 116 of the encapsulate 122 is shown in locations adjacent an outer edge of the integrated circuit packaging system 100 although it is understood that the offset 124 forming the recess 116 can be formed in any location. Further, the device contacts nearest the device 110 are shown as the second level contact 106 although it is understood that they may be different.

Referring now to FIG. 3, therein is shown a bottom plan view of the integrated circuit packaging system 100. The integrated circuit packaging system 100 preferably includes the bottom side 126 having the recess 116 of the encapsulate 122 with the first level contact 102, the second level contact 106.

For example, the first level contact 102 and the second level contact 106 can be formed in one or more concentric arrays at a perimeter of the device 110. The first level contact 102 can preferably be formed nearest an outer edge of the integrated circuit packaging system 100.

For illustrative purposes, the device 110 is shown substantially exposed adjacent the bottom side 126 although it is understood that the device 110 may also be partially covered or substantially covered adjacent the bottom side 126.

Figure 4:
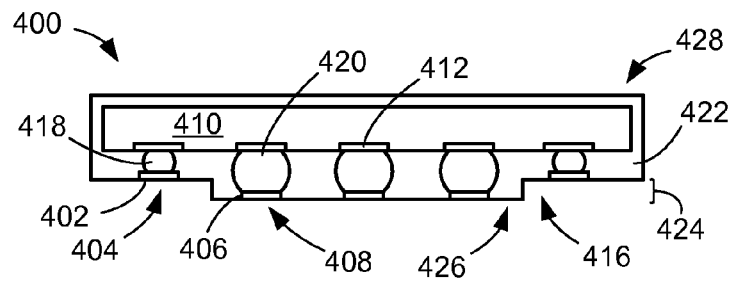
FIG. 4 is a cross-sectional view of an integrated circuit packaging system in a second embodiment of the present invention.

Referring now to FIG. 4, therein is shown a cross-sectional view of an integrated circuit packaging system 400 in a second embodiment of the present invention. The integrated circuit packaging system 400 preferably includes a first level contact 402 over or on a first external connection level 404, and a second level contact 406 over or on a second external connection level 408.

A portion of the first level contact 402 is substantially exposed adjacent the first external connection level 404 providing connectivity to other components such as devices or packages. Similarly, a portion of the second level contact 406 is substantially exposed adjacent the second external connection level 408 also providing connectivity to other components such as devices or packages.

A device 410 such as an integrated circuit or a package can be attached or mounted over the second external connection level 408 or the first external connection level 404. The device 410 can include connection regions 412 such as bond pads or bumps exposed on a side such as an active side of the device 410. The connection regions 412 provide electrical connectivity to circuitry in the device 410.

The first external connection level 404 with the first level contact 402 can be separated from the second external connection level 408 with the second level contact 406 by a recess 416. The recess 416 can provide spacing for connectors, isolation from other connectors, or varied sizes of connectors. For example, the recess 416 can provide the first external connection level 404 above the second external connection level 408.

For illustrative purposes, the recess 416 is shown providing the first external connection level 404 substantially parallel to the second external connection level 408 although it is understood that the recess 416 can provide other configurations for the first external connection level 404 or the second external connection level 408. Further, for illustrative purposes the recess 416 is shown as having a substantially orthogonal shape although it is understood that the recess 416 can be other shapes or configurations.

First level device connectors 418 such as solder bumps, solder balls, or other conductors can connect the connection regions 412 of the device 410 and the first level contact 402 for electrical transmission such as an electrical signal or level. Similarly, second level device connectors 420 such as bumps, balls, or other conductors can connect the connection regions 412 of the device 410 and the second level contact 406.

An encapsulate 422 having a bottom side 426 and a top side 428 can be formed over the device 410, the first level device connectors 418, the second level device connectors 420, the first level contact 402, or the second level contact 406. The encapsulate 422 can provide a portion of the first level contact 402 or the second level contact 406 substantially exposed.

The encapsulate 422 can provide an offset 424 between the first external connection level 404 and the second external connection level 408 forming the recess 416. The second external connection level 408 can be formed substantially planar to the bottom side 426 with the first external connection level 404 above the bottom side 426 and closer to the top side 428 than the second external connection level 408 by the offset 424.

The device 410 can preferably have a side such as a non-active side near the top side 428 covered or protected by the encapsulation. Further, the device 410 can preferably have an opposite side such as an active side over the first level device connectors 418 and the second level device connectors 420 for electrically connectivity.

Figure 5:
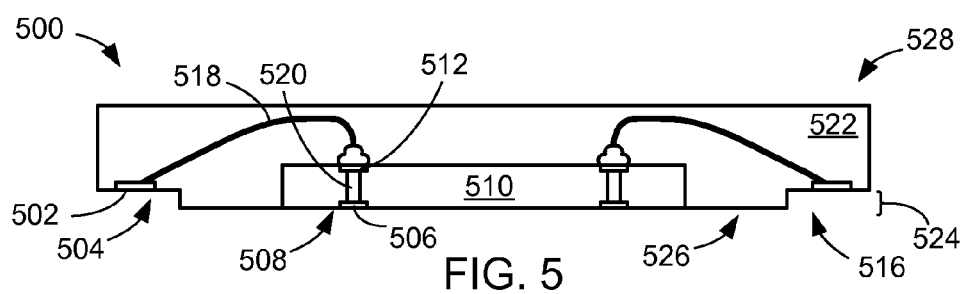
FIG. 5 is a cross-sectional view of an integrated circuit packaging system in a third embodiment of the present invention.

Referring now to FIG. 5, therein is shown a cross-sectional view of an integrated circuit packaging system 500 in a third embodiment of the present invention. The integrated circuit packaging system 500 preferably includes a first level contact 502 over or on a first external connection level 504, and a second level contact 506 over or on a second external connection level 508.

A portion of the first level contact 502 is substantially exposed adjacent the first external connection level 504 providing connectivity to other components such as devices or packages. Similarly, a portion of the second level contact 506 is substantially exposed adjacent the second external connection level 508 also providing connectivity to other components such as devices or packages.

A device 510 such as an integrated circuit or a package can be attached or mounted over or on the second external connection level 508 and adjacent to the first external connection level 504. The device 510 can include connection regions 512 such as bond pads or bumps exposed on a side such as an active side of the device 510. The connection regions 512 provide electrical connectivity to circuitry in the device 510.

The second level contact 506 can also be formed in a manner similar to the connection regions 512 of the device 510 whereby the device 510 can include the second level contact 506 exposed on a side opposite the connection regions 512 such as a non-active side. The second level contact 506 also provides electrical connectivity to circuitry in the device 510.

The first external connection level 504 with the first level contact 502 can be separated from the second external connection level 508 with the second level contact 506 by a recess 516. The recess 516 can provide spacing for connectors, isolation from other connectors, or varied sizes of connectors. For example, the recess 516 can provide the first external connection level 504 above the second external connection level 508.

For illustrative purposed, the recess 516 is shown providing the first external connection level 504 substantially parallel to the second external connection level 508 although it is understood that the recess 516 can provide other configurations for the first external connection level 504 or the second external connection level 508. Further, for illustrative purposes the recess 516 is shown as having a substantially orthogonal shape although it is understood that the recess 516 can be other shapes or configurations.

First level device connectors 518 such as bumps, balls, or other conductors can connect the connection regions 512 of the device 510 and the first level contact 502 for electrical transmission such as an electrical signal or level. Second level device connectors 520 such as through silicon vias or other conductors can connect the connection regions 512 of the device 510 and the second level contact 506.

The second level device connectors 520 or the second level contact 506 can connect to a redistribution layer (RDL) (not shown). The RDL can preferably be formed over the second external connection level 508 for electrical connectivity over a backside of the device 510. The second level device connectors 520 can also connect to the RDL for redistributing or relocating the second level contact 506.

An encapsulate 522 having a bottom side 526 and a top side 528 can be formed over the device 510, the first level device connectors 518, the second level device connectors 520, the first level contact 502, or the second level contact 506. The encapsulate 522 can provide a portion of the first level contact 502 or the second level contact 506 substantially exposed.

The encapsulate 522 can provide an offset 524 between the first external connection level 504 and the second external connection level 508 forming the recess 516. The second external connection level 508 can be formed substantially planar to the bottom side 526 with the first external connection level 504 above the bottom side 526 and closer to the top side 528 than the second external connection level 508 by the offset 524.

Figure 6:
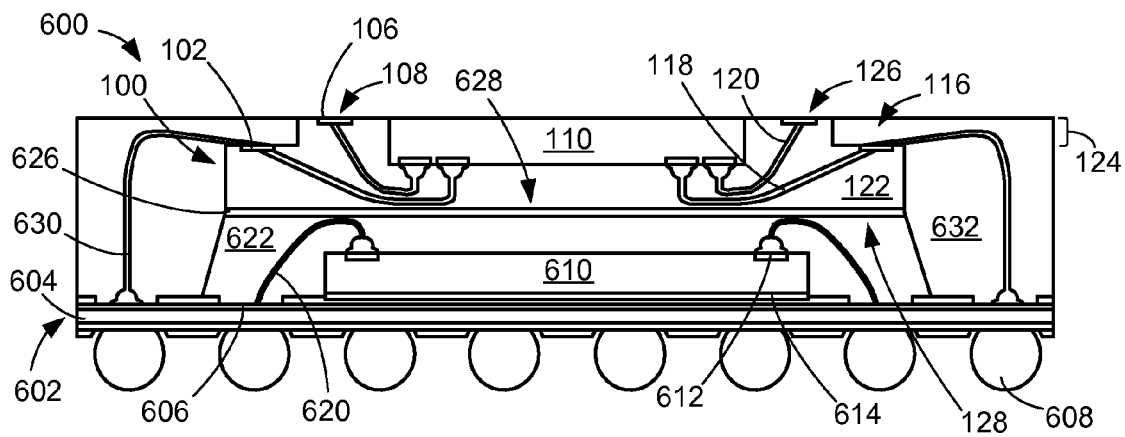
FIG. 6 is a cross-sectional view of an integrated circuit packaging system in a fourth embodiment of the present invention.

Referring now to FIG. 6, therein is shown a cross-sectional view of an integrated circuit packaging system 600 in a fourth embodiment of the present invention. The integrated circuit packaging system 600 includes the integrated circuit packaging system 100 as an internal stacking module.

The integrated circuit packaging system 600 preferably includes a substrate 602 having an insulator 604 and a conductor 606. A package connector 608 can be attached or formed over the conductor 606 to provide electrical connectivity to a next level system such as another package or a printed circuit board.

A base device 610 such as an integrated circuit or a package can be attached or mounted over or on the insulator 604 or the conductor 606. The base device 610 can included connection regions 612 such as bond pads or bumps exposed on a side such as an active side of the base device 610.

A base attach material 614 such as a fill or an adhesive can be applied to the base device 610 and the substrate 602. The base attach material 614 can provide a substantially fixed location for the base device 610. The base attach material 614 can include materials that are either conductive or non-conductive.

Device connectors 620 such as wires or other conductors can connect the connection regions 612 of the base device 610 and the conductor 606 of the substrate 602 for electrical transmission such as an electrical signal or level. A stack encapsulate 622 having a stack top side 628 can be formed over the base device 610, the device connectors 620, or a portion of the substrate 602.

The integrated circuit packaging system 100 can be attached or mounted over the stack top side 628 of the stack encapsulate 622. A stack attach material 626 such as a fill or an adhesive can be applied to the integrated circuit packaging system 100 and the stack top side 628.

Module connectors 630 such as wires or other conductors can connect the first level contact 102 and the conductor 606 of the substrate 602 for electrical transmission such as an electrical signal or level. The recess 116 can provide spacing for the module connectors 630.

A package encapsulate 632 can be formed over the integrated circuit packaging system 100, the module connectors 630, a portion of the stack encapsulate 622, or a portion of the substrate 602. The package encapsulate 632 can provide the second level contact 106 substantially exposed for electrical connectivity to a next level system such as a device or package.

For illustrative purposes, a portion of the device 110 is shown substantially exposed although it is understood that a portion the device 110 may also be partially covered or substantially covered.

Figure 7:
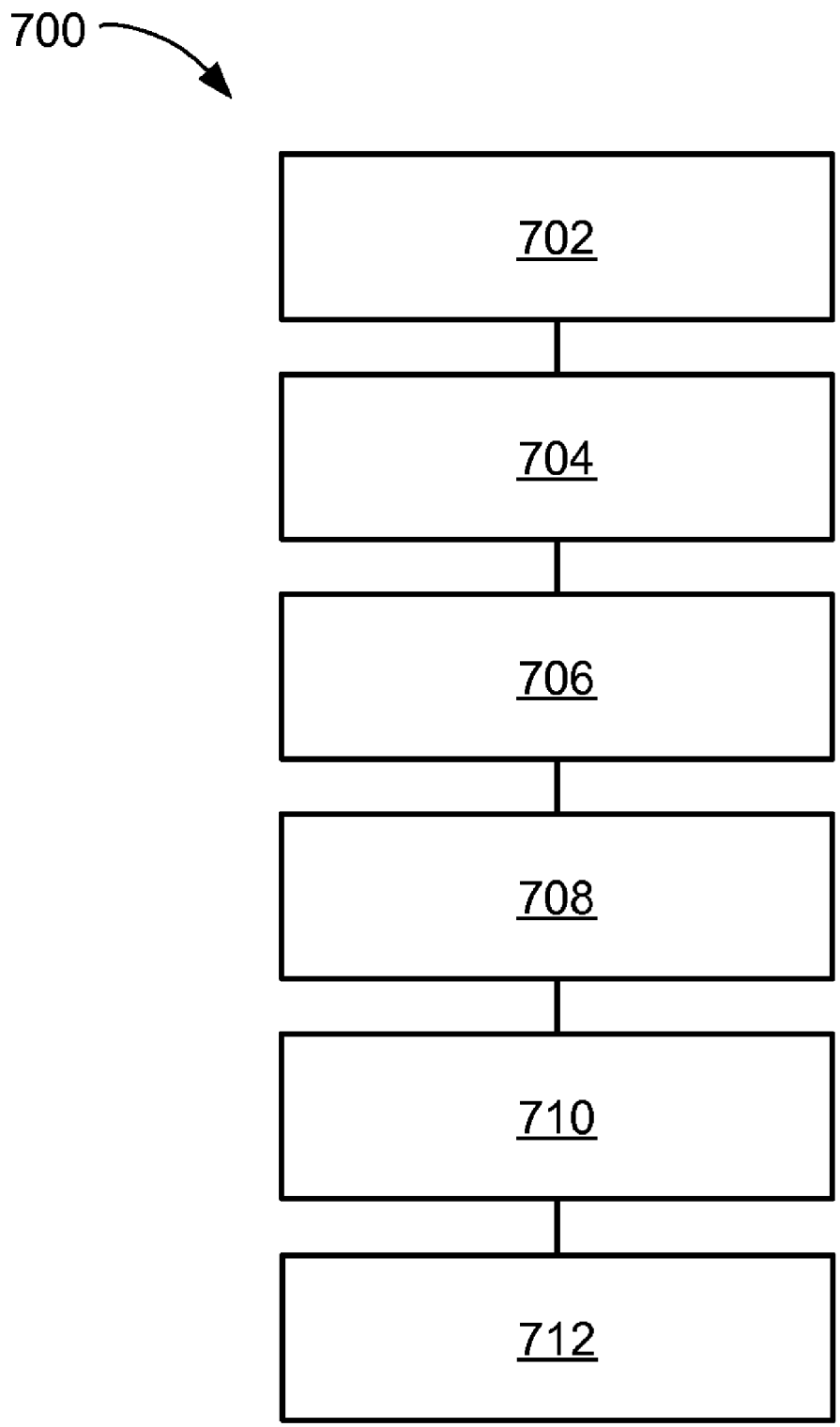
FIG. 7 is a flow chart of a method of manufacture of an integrated circuit packaging system in a further embodiment of the present invention.

Referring now to FIG. 7, therein is shown a flow chart of a method 700 of manufacture of an integrated circuit packaging system in a further embodiment of the present invention. The method 700 includes: forming a first level contact on a first external connection level in a block 702; forming a second level contact on a second external connection level next to the first external connection level in a block 704; attaching a device adjacent the first level contact and the second level contact in a block 706; attaching a first level device connector to the first level contact and the device in a block 708; attaching a second level device connector to the second level contact and the device in a block 710; and forming an encapsulate over the first level contact, the second level contact, the first level device connector, and the second level device connector in a block 712.

In greater detail, a system to provide the method and apparatus of the integrated circuit packaging system 100, in an embodiment of the present invention, is performed as follows:

1. Forming a first level contact on a first external connection level of a side of the package.
2. Forming a second level contact on a second external connection level of the side of the package next to the first external connection level.
3. Attaching a device having a connection region adjacent the first level contact and the second level contact.
4. Attaching a first level device connector to first level contact and the connection region.
5. Attaching a second level device connector to second level contact and another of the connection region.
6. Forming an encapsulate over the first level contact, the second level contact, the first level device connector, the second level device connector, and a portion of the device.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit packaging system comprising:
    forming a first level contact on a first external connection level;

forming a second level contact on a second external connection level, the second external connection level parallel to the first external connection level;
attaching a device adjacent the first level contact and the second level contact;
attaching a first level device connector to the first level contact and the device;
attaching a second level device connector to the second level contact and the device; and
forming an encapsulant over the first level contact, the second level contact, and the device for forming a package bottom at a bottom side of the encapsulant, the first external connection level, the second external connection level, and an inactive side of the device exposed from the package bottom.

2. The method as claimed in claim 1 wherein attaching the first level device connector includes attaching a wire to the first level contact and the device.

3. The method as claimed in claim 1 wherein attaching the first level device connector includes attaching a solder bump to the first level contact and the device.

4. The method as claimed in claim 1 wherein attaching the second level device connector includes attaching a through silicon via to the second level contact.

5. The method as claimed in claim 1 further comprising:
providing a substrate;
attaching a base device over the substrate;
applying a stack encapsulant over the base device and a portion of the substrate; and
attaching the encapsulant over the stack encapsulant.

6. A method of manufacture of an integrated circuit packaging system comprising:
forming a first level contact on a first external connection level of a side of the package;
forming a second level contact on a second external connection level of the side of the package, the second external connection level parallel to the first external connection level;
attaching a device having a connection region adjacent the first level contact and the second level contact;
attaching a first level device connector to the first level contact and the connection region;
attaching a second level device connector to the second level contact and another of the connection region; and
forming an encapsulant over the first level contact, the second level contact, and the device for forming a package bottom at a bottom side of the encapsulant, the first external connection level, the second external connection level, and an inactive side of the device exposed from the package bottom.

7. The method as claimed in claim 6 wherein attaching the second level device connector includes attaching a wire to the second level contact and the connection region.

8. The method as claimed in claim 6 wherein attaching the second level device connector includes attaching a solder ball to the second level contact and the connection region.

9. The method as claimed in claim 6 further comprising forming a redistribution layer over the device.

10. The method as claimed in claim 6 further comprising:
providing a substrate having a conductor;
attaching a base device over the substrate;
applying a stack encapsulant over the base device and a portion of the substrate;
attaching the encapsulant over the stack encapsulant;
attaching a module connector to the first level contact and the conductor; and
applying a package encapsulant over the module connector, a portion of the encapsulant, the stack encapsulant, and a portion of the substrate.

11. An integrated circuit packaging system comprising:
a first level contact on a first external connection level;
a second level contact on a second external connection level, the second external connection level parallel to the first external connection level;
a device adjacent the first level contact and the second level contact;
a first level device connector attached to the first level contact and the device;
a second level device connector attached to the second level contact and the device; and
an encapsulant over the first level contact, the second level contact, and the device for forming a package bottom at a bottom side of the encapsulant, the first external connection level, the second external connection level, and an inactive side of the device exposed from the package bottom.

12. The system as claimed in claim 11 wherein the first level device connector is a wire.

13. The system as claimed in claim 11 wherein the first level device connector is a solder bump.

14. The system as claimed in claim 11 wherein the second level device connector is a through silicon via.

15. The system as claimed in claim 11 further comprising:
a substrate;
a base device over the substrate;
a stack encapsulant over the base device and a portion of the substrate; and
the encapsulant attached over the stack encapsulant.

16. The system as claimed in claim 11 wherein:
the first level contact is on the first external connection level of a side of the package;
the second level contact is on the second external connection level of the side of the package and next to the first external connection level;
the device having a connection region is adjacent the first level contact and the second level contact;
the first level device connector is attached to the first level contact and the connection region;
the second level device connector is attached to the second level contact and another of the connection region; and
the encapsulant is formed over the first level contact, the second level contact, the first level device connector, the second level device connector, and a portion of the device.

17. The system as claimed in claim 16 wherein the second level device connector is a wire.

18. The system as claimed in claim 16 wherein the second level device connector is a solder ball.

19. The system as claimed in claim 16 further comprising a redistribution layer over the device.

20. The system as claimed in claim 16 further comprising:
a substrate having a conductor;
a base device over the substrate;
a stack encapsulant over the base device and a portion of the substrate and having the encapsulant thereover;
a module connector attached to the first level contact and the conductor; and
a package encapsulant over the module connector, a portion of the encapsulant, the stack encapsulant, and a portion of the substrate.

* * * * *

UNITED STATES PATENT AND TRADEMARK OFFICE
CERTIFICATE OF CORRECTION

PATENT NO. : 8,080,885 B2  
APPLICATION NO. : 12/273547  
DATED : December 20, 2011  
INVENTOR(S) : Chow et al.

Page 1 of 3

It is certified that error appears in the above-identified patent and that said Letters Patent is hereby corrected as shown below:

Column 2:
lines 17-18, delete "an encapsulate over the first level" and insert therefor --an encapsulant over the first level-- line 28, delete "an encapsulate over the first level" and insert therefor --an encapsulant over the first level-- line 40, add double dashes between numbers 1-1 as follows: delete "line 1-1 of FIG. 3" and insert therefor --line 1--1 of FIG. 3-- line 43, add double dashes between numbers 2-2 as follows: delete "line 2-2 of FIG. 3." and insert therefor --line 2--2 of FIG. 3.--

Column 3:
line 41, add double dashes between numbers 1-1 as follows: delete "line 1-1 of FIG. 3" and insert therefor --line 1--1 of FIG. 3--

Column 4:
lines 21-28, delete "An encapsulate 122 having a bottom side 126 and a top side 128 can be formed over the device 110, the first level device connectors 118, the second level device connectors 120, the first level contact 102, or the second level contact 106 for forming a package bottom at the bottom side 126 of the encapsulate 122. The encapsulate can provide a portion of the first level contact 102 or the second level contact 106 substantially exposed. The forming of the encapsulate 122 provides"

and insert therefor

--An encapsulant 122 having a bottom side 126 and a top side 128 can be formed over the device 110, the first level device connectors 118, the second level device connectors 120, the Signed and Sealed this  
Twenty-fifth Day of September, 2012

David J. Kappos  
*Director of the United States Patent and Trademark Office*

CERTIFICATE OF CORRECTION (continued)
U.S. Pat. No. 8,080,885 B2 first level contact 102, or the second level contact 106 for forming a package bottom at the bottom side 126 of the encapsulant 122. The encapsulant can provide a portion of the first level contact 102 or the second level contact 106 substantially exposed. The forming of the encapsulant 122 provides--

Column 4:
line 32, delete "The encapsulate 122 can provide" and insert therefor --The encapsulant 122 can provide-- line 63, add double dashes between numbers 2-2 as follows: delete "along line 2-2 of FIG. 3." and insert therefor --along line 2--2 of FIG. 3.--

Column 5:
line 8, delete "of the encapsulate 122 is shown" and insert therefor --of the encapsulant 122 is shown-- lines 18-19, delete "of the encapsulate 122 with the first level" and insert therefor --of the encapsulant 122 with the first level--

Column 6:
line 5, delete "An encapsulate 422 having a bottom side" and insert therefor --An encapsulant 422 having a bottom side-- lines 8-9, delete "The encapsulate 422 can provide" and insert therefor --The encapsulant 422 can provide-- line 11, delete "The encapsulate 422 can provide" and insert therefor --The encapsulant 422 can provide--

Column 7:
line 15, delete "An encapsulate 522 having a bottom" and insert therefor --An encapsulant 522 having a bottom-- line 19, delete "encapsulate 522 can provide a portion" and insert therefor --encapsulant 522 can provide a portion-- line 21, delete "The encapsulate 522 can provide" and insert therefor --The encapsulant 522 can provide-- line 53, delete "encapsulate 622 having a stack top" and insert therefor --encapsulant 622 having a stack top-- lines 57-58, delete "of the stack encapsulate 622." and insert therefor --of the stack encapsulant 622.-- lines 65-67, delete "A package encapsulate 632 can be formed over the integrated circuit packaging system 100, the module connectors 630, a portion of the stack encapsulant 622, or a portion"

and insert therefor --A package encapsulant 632 can be formed over the integrated circuit packaging system 100, the module connectors 630, a portion of the stack encapsulant 622, or a portion--

Column 8:
line 1, delete "The package encapsulate 632 can provide" and insert therefor --The package encapsulant 632 can provide-- lines 19-20, delete "forming an encapsulate over the first level" and insert therefor --forming an encapsulant over the first level-- line 37, delete "an encapsulate over the first level" and insert therefor --an encapsulant over the first level-- line 56, delete "of the a foregoing description." and insert therefor --of the aforegoing description.-- line 59, delete "All matters hitherto fore set forth" and insert therefor --All matters hithertofore set forth--